United States Patent [19]
Duvvury et al.

[11] Patent Number: 5,986,867
[45] Date of Patent: Nov. 16, 1999

[54] PROTECTION CIRCUIT FOR OUTPUT DRIVERS

[75] Inventors: Charvaka Duvvury, Plano; Michael D. Chaine, Missouri City, both of Tex.

[73] Assignee: Texas Instruments Incorporated, Dallas, Tex.

[21] Appl. No.: 09/120,992

[22] Filed: Jul. 22, 1998

[51] Int. Cl.[6] .................................................. H02H 3/22
[52] U.S. Cl. ............................................ 361/111; 361/56
[58] Field of Search .............................. 361/56, 91, 111; 257/355–362

[56] References Cited

U.S. PATENT DOCUMENTS 5,499,152   3/1996   Tamakoshi ................................ 361/56

OTHER PUBLICATIONS

"Lateral DMOS Design for ESD Robustness", Texas Instruments, pp. 1–4 (Charvaka Duvvury, Fred Carvajal, Clif Jones and David Briggs), no date.

*Primary Examiner*—Michael J. Sherry
*Attorney, Agent, or Firm*—Jacqueline J. Garner; Wade James Brady; Richard L. Donaldson

[57] ABSTRACT

A DRAM output protection circuit (100). A dummy NMOS transistor (116) is connected in parallel with the NMOS output transistor (102). The gate of the dummy transistor (116) is connected through a resistor (122) to ground (108). The resistor 122 value and the gate capacitance (121,127) of the dummy transistor (116) are adjusted to achieve the desired gate matching between the dummy transistor gate (120) and the NMOS output transistor gate (110).

16 Claims, 2 Drawing Sheets

PROTECTION CIRCUIT FOR OUTPUT DRIVERS

FIELD OF THE INVENTION

The invention is generally related to the field of ESD protection and more specifically to ESD protection for output drivers.

BACKGROUND OF THE INVENTION

In synchronous DRAM applications, the output buffer comprises a NMOS pull-up transistor and a NMOS pull-down transistor. ESD protection needs to be provided at this output buffer without the use of any protection device that would require a series resistor due to the high speed requirements of the device. The synchronous DRAM is designed to operate at greater than 60 MHz, so switching of the outputs high and low is critical. Any resistance in the speed path will slow down the output driver. Furthermore, a protection scheme that works for both positive and negative stress polarities is beneficial.

One prior art output protection scheme used in logic applications is shown in FIG. 1. This scheme uses a pull-up PMOS transistor 20 to power the dummy protection transistor 22 during an ESD pulse. The dummy protection transistor 22 is connected in parallel with the output NMOS transistor 24 and has a gate tied off (i.e., to 0V) with Vcc power up through PMOS transistor 20 and a source tied to a grounded substrate. The pull-up PMOS provides automatic protection to Vcc. In other applications, the gate of transistor 22 is directly connected to ground.

Unfortunately, in DRAM applications, a PMOS pull-up is not available to power up Vcc during ESD. The prior art dummy transistor relies on the PMOS pull-up for its operation during ESD. Furthermore, without the pull-up PMOS, there is no automatic protection to Vcc. Finally, for floating substrate DRAMs, there is no diode to substrate and if the gate of the protection is not properly controlled or is grounded, the ESD level will be lower for negative stress polarities. It is now well known that ESD protection levels in a multi-finger NMOS transistor can become erratic when a grounded gate protection device is used.

Accordingly, a protection scheme that is more appropriate for floating substrate DRAMs, as well as one that can be extended to grounded substrate technologies, is desired.

SUMMARY OF THE INVENTION

The invention is an output protection circuit. A dummy NMOS transistor is connected in parallel with the NMOS output transistor. The gate of the dummy transistor is connected through a resistor to ground. The resistor value and the capacitance between the gate of the dummy transistor and the source/drain at the pad side of the device are adjusted to achieve the desired gate matching between the dummy transistor gate and the NMOS output transistor gate.

An advantage of the invention is providing an output protection circuit capable of being used in floating substrate applications.

Another advantage of the invention is providing an output protection circuit that requires no isolation resistance at the drain of the output.

Another advantage of the invention is providing an output protection circuit design that can be easily varied to obtain the desired protection level.

Another advantage of the invention is providing an output protection circuit design that can be applied to both floating substrate and grounded substrate technologies.

These and other advantages will be apparent to those of ordinary skill in the art having reference to the specification in conjunction with the drawings.

DETAILED DESCRIPTION OF THE EMBODIMENTS

Because the substrate is left floating in many DRAM applications, the output NMOS transistor can potentially be a good self-protecting device. However, due to the uncertainty of its gate potential, the output NMOS transistor may not fully be effective as a npn protection device. Furthermore, in some output designs the NMOS may not be large enough to offer the needed protection. The invention overcomes the problem of gate potential uncertainty to enable the output NMOS transistor to be used to its fullest extent for ESD protection.

The invention will be described in conjunction with a synchronous DRAM NMOS output driver. However, it will be apparent to those of ordinary skill in the art that the invention may be applied to other DRAM is designs, logic designs and may be used in conjunction with both CMOS and NMOS output drivers.

Figure 1:
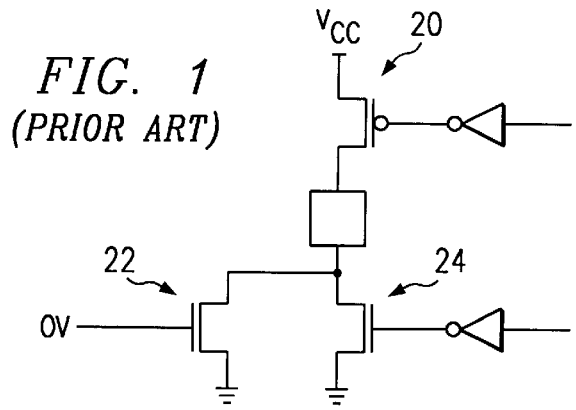
FIG. 1 is a schematic diagram of a prior output protection scheme for logic applications.
Figure 2:
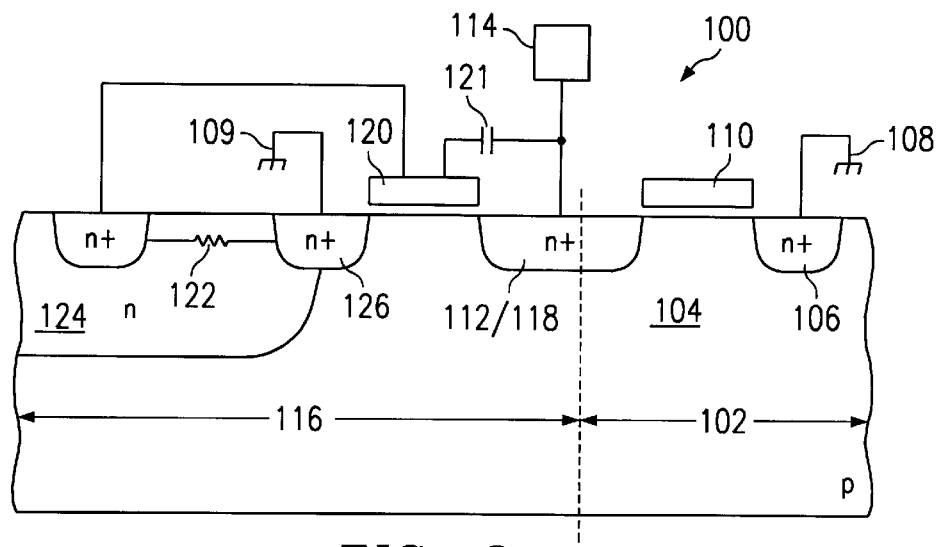
FIG. 2 is a cross-sectional diagram of the output protection according to the invention.

A cross-section of the output protection 100 for a pull-down transistor according to the invention is shown in FIG. 2. NMOS output transistor 102 is the pull-down transistor of the DRAM output buffer and is typically a multi-finger output device located in substrate 104. NMOS output transistor 102 has a source 106 connected to a source potential (e.g. ground) 108. The gate electrode 110 is connected to the appropriate internal circuitry and the drain (region 112) is connected to the output pad 114.

Dummy transistor 116 is connected in parallel with NMOS output transistor 102. The drain of dummy transistor 116 is connected to pad 114. The drain of both the dummy transistor 116 and output transistor 102 is formed using the same n-type region 112. The gate 120 is connected through a resistor 122 to a source potential 109. Resistor 122 is shown as a n-well resistor (using n-well 124). Of course, resistor 122 may alternatively comprise other materials as is known in the art. For example. resistor 122 may be a polysilicon resistor or a silicided diffusion region. The source 126 of dummy transistor 116 is connected to the source potential 108. The circuit may rely on the inherent capacitance between the dummy transistor gate 120 and the drain 112 or a discrete capacitor may be placed between the gate 120 and pad 114. Capacitor 121 is intend to illustrate either case.

Source potentials 108 and 109 may be the same source or they may be different. In some cases, such as the floating substrate DRAMS, it may be advantageous to use separate sources. The source 108 for transistor 116 may be the same as the local ground used by the output driver (transistor 102). Source 109 may then be a separate ground not used by the output driver.

The respective widths of transistors 102 and 116 are chosen so that the sum of the widths provides the total desired protection level as determined by the technology in V/:m. For example, at 10V/:m if a transistor width of 400 microns is needed to the desired ESD protection level, the sum of the width of NMOS output transistor 102 and the width of dummy transistor 116 is 400 microns.

The channel length of transistor 102 is chosen to account for hot carrier reliability as is known in the art. It is usually selected to be 20% larger than the minimum geometry for the technology. The length of dummy transistor 116 can be at minimum as hot carrier reliability is not a concern for the dummy transistor 116.

Figure 3:
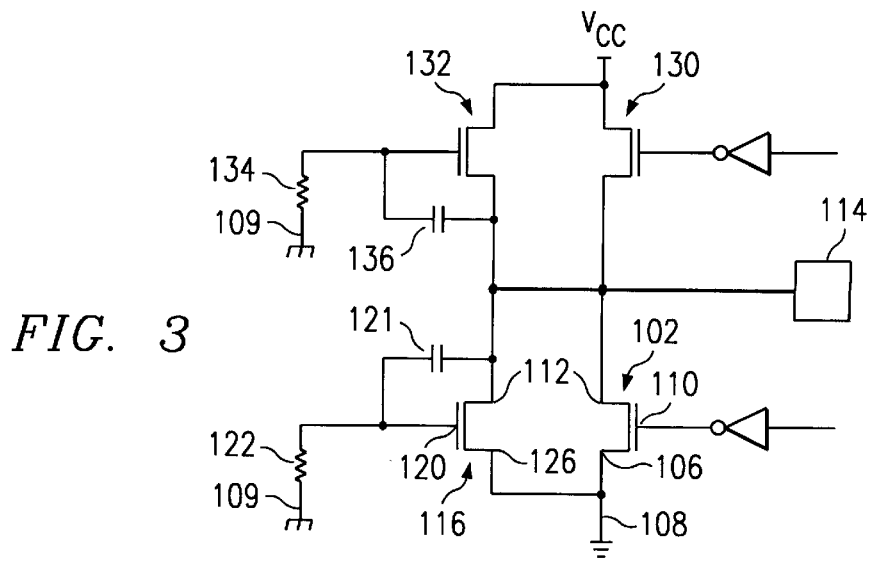
FIG. 3 is a schematic diagram of the output protection for both the pull-up and pull-down output transistors according to the invention.

A similar protection scheme can also be used for the pull-up NMOS transistor 130. A schematic showing both protection schemes is shown in FIG. 3. A second dummy transistor 132 is connected in parallel with the pull-up output transistor 130. The drains of the second dummy transistor 132 and the pull-up NMOS transistor 130 are connected to Vcc and the sources are connected to the output pad 114. The gate of the second dummy transistor is also connected through a resistor 134 to a source potential 108. An optional capacitor 136 may be placed between the gate of dummy transistor 132 and the source/drain region at the pad 114 side for further control over the gate coupling as discussed below.

Figure 4:
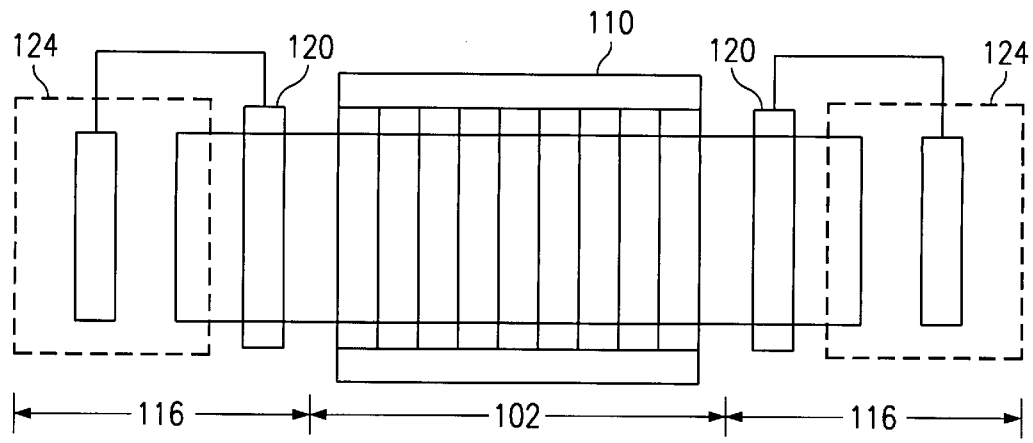
FIG. 4 is a top view of the output protection for a pull-down output transistor according to the invention.

A top view of the output transistor 102 and associated dummy transistor 116 is shown in FIG. 4. The multiple fingers of the output transistor 102 are shown. The dummy transistor 116 is split in half and located on each end of the output transistor 102. It is important that the dummy transistor 116 be placed in close proximity to the output transistor 102. It is also important that the contact to gate spacings (for drain and source) on both the dummy and output transistors are matched.

The operation of the output protection circuit shown in FIGS. 2 and 4 will now be discussed. It is assumed for this discussion that the output transistor 102 has a larger width than the dummy transistor 116. In this case, the resistor 122 and capacitance 121 values are chosen such that the gate 120 of the dummy transistor 116 couples higher than the gate of the output transistor 102 during ESD. The resistor/capacitor may by designed by using computer simulations (such as SPICE) of the full output circuit with the dummy transistor. A ramp of 0→Vav (avalanche breakdown of the drain junction) is applied in 500 ps pulses to represent the fast rise time to drain avalanche during the ESD pulse. From this, the relative gate couplings can be determined.

For positive ESD stress with respect to the source potential 108, dummy transistor 116 goes into breakdown mode first since its gate potential is designed to be higher. The triggering of dummy transistor 116 in close proximity to output transistor 102 allows carriers to be collected by the junctions of the output transistor 102. This facilitates the turn-on of the output transistor 102. In the worst case, the gate of the output transistor 102 is at ground potential from a previous cycle. Even in this case, the triggering of the dummy transistor 116 near the output transistor 102 causes sufficient carriers to be collected by the junctions of the output transistor to trigger the output transistor 102. The triggering of both the dummy transistor 116 and output transistor 102 thus ensures that the maximum protection is given.

For negative stress to Vss (with the substrate floating), since the dummy transistor 116 is not directly connected to the source, the saturated MOS turn-on of the device is avoided. That is, the charging up of the gate potential is delayed by the RC time constant (resistor 122 and gate oxide capacitances. So, even if the output transistor gate is a zero volts from a previous state, the protection device will turn-on first to give the needed protection.

An additional advantage of having the dummy transistor 116 trigger first is that it will go into snapback first and any type of interface traps created will be in the dummy transistor 116 only. The output transistor 102 will see relatively lower trapping effects and hence will be much less prone to degradation in the hot carrier lifetime. The longer channel of the output transistor 102 will ensure hit carrier reliability.

The above discussion assumed that the width of the output transistor 102 was larger than the width of the dummy transistor 116. If instead, the width of the dummy transistor 116 is larger, then the R/C values should be adjusted so that the gate of the output transistor 102 couples higher than the gate of the dummy transistor 116. If the simulations show that the output gate does not couple higher, then a capacitor 128 may be added between the drain and gate of output 102. This ensures that both transistors will eventually turn-on under ESD and both will help provide ESD protection. If the widths are equal, then the R/C values should be adjusted so that the gate of the dummy transistor 116 couples to the same level as the output transistor 102. Even with higher gate coupling, the longer channel for output will ensure hot carrier reliability.

Figure 5:
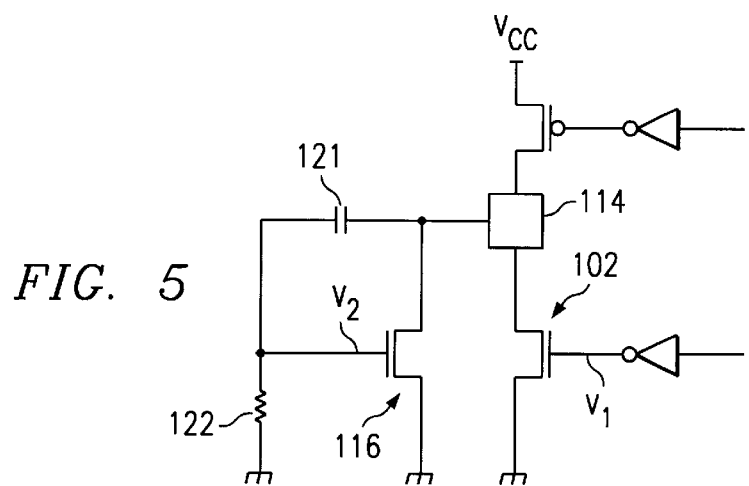
FIG. 5 is a schematic diagram of the output protection of the invention applied to a ground substrate device.
Figure 6:
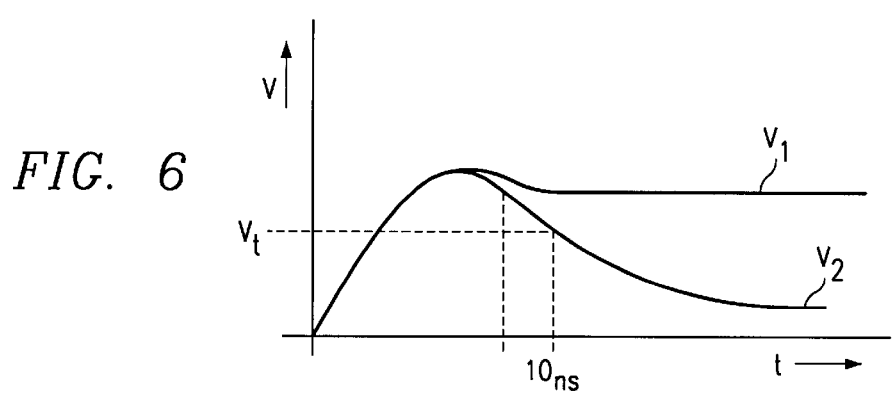
FIG. 6 is a graph of gate voltage versus time for the circuit of FIG. 5.

The dummy protection strategy will be different if the substrate is grounded as in logic chips. The dummy protection for grounded substrates is shown in FIG. 5. In this case, whether the output width is greater than the dummy width or the dummy width is greater than the output width, the gate couplings are matched (at least for the first 10 ns) as shown in FIG. 6. This is because the local substrate effects cannot be relied on with a grounded substrate. If the diffusions are not silicided, then the drain contact to gate spacings on both are also matched.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A output circuit comprising:
    a MOS output transistor connected between a pad and a voltage potential and having a gate connected to internal circuitry;
    a dummy transistor connected in parallel with said MOS output transistor, said dummy transistor located in close proximity to said MOS output transistor;
    a resistor connected between a gate of said dummy transistor and ground; and
    a discrete capacitor coupled between a gate of said dummy transistor and said pad.

2. The circuit of claim 1, wherein said circuit has a floating substrate and either a value of said resistor or a value of a capacitance on the gate of said dummy transistor or both is adjusted such that the gate of the larger of the MOS output transistor and the dummy transistor is coupled to a higher voltage than the other.

3. The circuit of claim 1, wherein said MOS output transistor has a larger width than said dummy transistor.

4. The circuit of claim 3, wherein either the resistance, capacitance, or both on the gate of the dummy transistor is selected such that the gate of the dummy transistor is coupled to a higher voltage than the gate of the MOS output transistor.

5. The circuit of claim 1, wherein the width of said dummy transistor is chosen such that the sum of the width of the dummy transistor and the width of the MOS output transistor approximately equals that required to provide a desired ESD protection level.

6. The circuit of claim 1, wherein a length of said dummy transistor is less than a length of said MOS output transistor.

7. The circuit of claim 1, wherein said voltage potential is ground.

8. The circuit of claim 1, wherein said voltage potential is a high supply voltage.

9. The circuit of claim 1, wherein said circuit has a grounded substrate and wherein a gate coupling of said dummy transistor is matched to a gate coupling of said MOS output transistor for at least 10 ns.

10. An output circuit, comprising:
   a first output transistor connected between a pad and a source potential and having a gate connected to internal circuitry;
   a first dummy transistor connected in parallel with said first output transistor, said first dummy transistor located in close proximity to said first output transistor;
   a first resistor connected between a gate of said first dummy transistor and ground;
   a second output transistor connected between said pad and a supply voltage;
   a second dummy transistor connected in parallel with said second output transistor, said second dummy transistor located in close proximity to said second output transistor;
   a second resistor connected between a gate of said second dummy transistor and ground; and
   a capacitor connected between said gate of said second dummy transistor and said pad.

11. The circuit of claim 10, wherein either a value of said resistor, a value of a capacitance of the gate of said first dummy transistor, or both is adjusted such that the gate of the larger of the first output transistor and the first dummy transistor is coupled to a higher voltage.

12. The circuit of claim 10, wherein said first output transistor has a larger width than said first dummy transistor.

13. The circuit of claim 12, wherein either the resistance, capacitance, or both on the gate of the first dummy transistor is selected such that the gate of the first dummy transistor is coupled to a higher voltage than the gate of the first output transistor.

14. The circuit of claim 10, wherein the width of said first dummy transistor is chosen such that the sum of the width of the first dummy transistor and the width of the first output transistor approximately equals that required to provide a desired ESD protection level.

15. The circuit of claim 10, wherein a length of said first dummy transistor is less than a length of said first output transistor.

16. The circuit of claim 10, wherein said source potential is ground.

* * * * *

UNITED STATES PATENT AND TRADEMARK OFFICE
CERTIFICATE OF CORRECTION

PATENT NO. : 5,986,867
DATED : November 16, 1999
INVENTOR(S) : Charvaka Duvvury and Michael D. Chaine It is certified that error appears in the above-identified patent and that said Letters Patent is hereby corrected as shown below:

On the Title page, please insert the following after " Related U.S. Applications Data":

[60] Provisional Application No. 60/053,612 filed 07/24/1997.

Signed and Sealed this

Twenty-sixth Day of December, 2000

Attest:

Q. TODD DICKINSON

Attesting Officer

Director of Patents and Trademarks